US011177401B2

(12) United States Patent
Spiegel et al.

(10) Patent No.: US 11,177,401 B2
(45) Date of Patent: Nov. 16, 2021

(54) SYSTEM AND METHOD FOR ILLUMINATING A SAMPLE AND COLLECTING LIGHT REFLECTED FROM THE SAMPLE

(71) Applicant: Zfx GmbH, Dachau (DE)

(72) Inventors: Hermann Spiegel, Constance (DE); Andreas Geier, Gargazon (IT)

(73) Assignee: Zfx GmbH, Dachau (DE)

( * ) Notice: Subject to any disclaimer, the term of this patent is extended or adjusted under 35 U.S.C. 154(b) by 706 days.

(21) Appl. No.: 15/915,169

(22) Filed: Mar. 8, 2018

(65) Prior Publication Data

US 2018/0198004 A1 Jul. 12, 2018

Related U.S. Application Data

(63) Continuation of application No. 13/796,484, filed on Mar. 12, 2013, now Pat. No. 9,947,813.

(30) Foreign Application Priority Data

Jul. 27, 2012 (EP) .................................... 12178355

(51) Int. Cl.
*H01L 31/0232* (2014.01)
*H01L 27/146* (2006.01)
(Continued)

(52) U.S. Cl.
CPC ...... *H01L 31/02325* (2013.01); *G01S 7/4815* (2013.01); *G01S 7/4911* (2013.01);
(Continued)

(58) Field of Classification Search
CPC ............. H01L 31/02325; H01L 27/146; G01S 7/4815; G01S 7/4911; G01S 17/42; G01S 7/48; G01S 17/88; G01S 17/89
See application file for complete search history.

(56) References Cited

U.S. PATENT DOCUMENTS 5,818,587 A 10/1998 Devaraj et al.
6,594,011 B1 7/2003 Kempen
(Continued)

FOREIGN PATENT DOCUMENTS

DE 4301538 A1 7/1994
DE 102008048963 A1 4/2010
(Continued)

OTHER PUBLICATIONS

"U.S. Appl. No. 13/796,484, Advisory Action dated Jul. 23, 2015", 4 pgs.

(Continued)

*Primary Examiner* — Que Tan Le
*Assistant Examiner* — Don J Williams
(74) *Attorney, Agent, or Firm* — Schwegman Lundberg & Woessner, P.A.

(57) ABSTRACT

A scanning system can include an illuminator, configured to produce an illuminating beam, and a fixation unit, configured to mechanically support a sample to be measured within the illuminating beam. The illuminating beam can reflect off the sample to produce reflected light. The system can further include a sensor, positioned angularly away from the illuminator, configured to receive the reflected light. The illuminating beam can include a wavelength spectrum having a FWHM less than 100 nm. In some examples, the fixation unit can be positioned based, in part, on a position of the illuminator and the sensor. In some examples, the sensor can include at least one imaging element that produces an image of the sample. In some examples, the illuminating beam can include a calibration pattern. In some examples, the illuminating beam and the reflected light can be angularly separated between ten degrees and fifteen degrees.

20 Claims, 3 Drawing Sheets

(51) Int. Cl.
*G01S 17/48* (2006.01)
*G01S 17/42* (2006.01)
*G01S 17/88* (2006.01)
*G01S 17/89* (2020.01)
*G01S 7/481* (2006.01)
*G01S 7/4911* (2020.01)

(52) U.S. Cl.
CPC .............. *G01S 17/42* (2013.01); *G01S 17/48* (2013.01); *G01S 17/88* (2013.01); *G01S 17/89* (2013.01); *H01L 27/146* (2013.01)

(56) References Cited

U.S. PATENT DOCUMENTS

| | | | |
|---|---|---|---|
| 7,259,871 | B2 | 8/2007 | Chen |
| 8,160,334 | B2 | 4/2012 | Thiel et al. |
| 8,434,924 | B1 * | 5/2013 | Hamburgen ......... G02B 6/0068 362/612 |
| 2002/0075484 | A1 | 6/2002 | Cohen-Sabban |
| 2007/0046663 | A1 * | 3/2007 | Brinkmann ............ A61C 9/006 345/419 |
| 2007/0238957 | A1 | 10/2007 | Yared |
| 2008/0273193 | A1 | 11/2008 | Nishiyama et al. |
| 2010/0284589 | A1 | 11/2010 | Thiel et al. |
| 2010/0311005 | A1 | 12/2010 | Liang |
| 2011/0080576 | A1 | 4/2011 | Thiel et al. |
| 2014/0027614 | A1 | 1/2014 | Geier |

FOREIGN PATENT DOCUMENTS

| | | |
|---|---|---|
| DE | 102008048963 B4 | 8/2011 |
| DE | 102011008655 A1 | 7/2012 |
| EP | 1757902 B1 | 11/2007 |
| EP | 2258254 A1 | 12/2010 |
| EP | 2241247 B1 | 5/2012 |
| JP | 2001099615 A | 4/2001 |
| WO | WO-2008033218 A1 | 3/2008 |

OTHER PUBLICATIONS

"U.S. Appl. No. 13/796,484, Advisory Action dated Sep. 19, 2016", 5 pgs.
"U.S. Appl. No. 13/796,484, Examiner Interview Summary dated Feb. 3, 2017", 3 pgs.
"U.S. Appl. No. 13/796,484, Examiner Interview Summary dated Feb. 8, 2016", 3 pgs.
"U.S. Appl. No. 13/796,484, Examiner Interview Summary dated Aug. 18, 2017", 3 pgs.
"U.S. Appl. No. 13/796,484, Final Office Action dated Jun. 1, 2016", 14 pgs.
"U.S. Appl. No. 13/796,484, Final Office Action dated Jun. 4, 2015", 21 pgs.
"U.S. Appl. No. 13/796,484, Non Final Office Action dated May 18, 2017", 17 pgs.
"U.S. Appl. No. 13/796,484, Non Final Office Action dated Oct. 12, 2016", 14 pgs.
"U.S. Appl. No. 13/796,484, Non Final Office Action dated Nov. 19, 2015", 14 pgs.
"U.S. Appl. No. 13/796,484, Non Final Office Action dated Dec. 1, 2014", 18 pgs.
"U.S. Appl. No. 13/796,484, Notice of Allowance dated Dec. 13, 2017", 8 pgs.
"U.S. Appl. No. 13/796,484, Reponse filed Aug. 24, 2016 to Final Office Action dated Jun. 1, 2016", 11 pgs.
"U.S. Appl. No. 13/796,484, Response filed Feb. 1, 2017 to Non Final Office Action dated Oct. 12, 2016", 12 pgs.
"U.S. Appl. No. 13/796,484, Response filed Feb. 3, 2016 to Non Final Office Action dated Nov. 19, 2015", 10 pgs.
"U.S. Appl. No. 13/796,484, Response filed Mar. 26, 2015 to Non-Final Office Action dated Dec. 1, 2014", 16 pgs.
"U.S. Appl. No. 13/796,484, Response filed Jul. 10, 2015 to Final Office Action dated Jun. 4, 2015", 15 pgs.
"U.S. Appl. No. 13/796,484, Response filed Aug. 11, 2017 to Non Final Office Action dated May 18, 2017", 13 pgs.
"U.S. Appl. No. 13/796,484, Response filed Sep. 30, 2015 to Advisory Action dated Jul. 23, 2015", 15 pgs.
Chang, S J, et al., "InGaN—GaN Multiquantum-well Blue and Green Light-emitting Diodes", IEEE Journal of Selected Topics in Quantum Electronics IEEE J. Select. Topics Quantum Electron vol. 8, No. 2, (2002), 278-83.
Funato, et al., "Blue, Green, and Amber InGaN/GaN Light-Emitting Diodes on Semipolar {11-22} GaN Bulk Substrates", Japanese Journal of Applied Physics Jpn. J. Appl. Phys, (2006), 659-662.
Li, Yufeng, et al., "Defect-reduced Green GaInN/GaN Light-emitting Diode on Nanopatterned Sapphire", Applied Physics Letters Appl. Phys. Lett. 98, 151102, (2011), 4 pgs.
Mongon, Bill, et al., "What light color should a White-Light-Scanner use?", CMSC—New Orleans, Breuckmann, Precision in 3D, (Jul. 16, 2012), 20 pgs.
U.S. Appl. No. 13/796,484, filed Mar. 12, 2013, System and Method for Illuminating a Sample and Collecting Light Reflected From the Sample.

* cited by examiner

SYSTEM AND METHOD FOR ILLUMINATING A SAMPLE AND COLLECTING LIGHT REFLECTED FROM THE SAMPLE

CLAIM OF PRIORITY

This application is a continuation of U.S. patent application Ser. No. 13/796,484, filed Mar. 12, 2013, which patent document claims the benefit of priority of European Patent Application Serial Number EP 12178355, entitled "Scanning Unit," filed on Jul. 27, 2012, both of which are hereby incorporated by reference herein in their entireties.

TECHNICAL FIELD

The present disclosure relates to a scanning system and a method for illuminating a sample, reflecting illuminating light off the sample, and sensing the illuminating light.

BACKGROUND

Published document DE 10 2008 048 963 A1 discusses a scanning unit that can determine a three-dimensional geometry of an object. The scanning unit uses both a static light source and a dynamic light source, with the static and dynamic light sources having distinctively different illumination spectra to obtain a data set of the object.

U.S. Pat. No. 5,818,587 discusses an apparatus for measuring an image of a tooth or a gum of a patient. In the apparatus, light emitted by a light source and transmitted through the tooth or the gum is used to obtain two-dimensional images or computer tomographic images of the tooth or the gum.

OVERVIEW

A scanning system can include an illuminator, configured to produce an illuminating beam, and a fixation unit, configured to mechanically support a sample to be measured within the illuminating beam. The illuminating beam can reflect off the sample to produce reflected light. The system can further include a sensor, positioned angularly away from the illuminator, configured to receive the reflected light. The illuminating beam can have a wavelength spectrum having a FWHM less than 100 nm. In some examples, the fixation unit can be positioned with respect to the illuminator and the sensor. In some examples, the sensor can include at least one imaging element that produces an image of the illuminated sample. In some examples, the illuminating beam can include a calibration pattern. In some examples, the illuminating beam and the reflected light can be angularly separated between ten degrees and fifteen degrees. In some examples, the illuminating beam can produce green light. In some examples, multiple images are taken of the sample, each from a different orientation, and the multiple images can be used to form a three-dimensional representation of the sample.

To further illustrate the present scanning system and method disclosed herein, a non-limiting list of examples is provided here:

In Example 1, a scanning system can comprise an illuminator, a fixation unit, and a sensor. The illuminator can be configured to produce an illuminating beam including a wavelength spectrum having a full-width-at-half-maximum (FWHM) less than 100 nm. The fixation unit can be configured to mechanically support a sample to be measured within the illuminating beam, the latter of which can be configured to reflect off the sample to produce reflected light. The sensor can be positioned angularly away from the illuminator and configured to receive the reflected light.

In Example 2, the scanning system of Example 1 can optionally be configured such that the fixation unit is positioned based on a position of the illuminator and the sensor.

In Example 3, the scanning system of any one or any combination of Examples 1 or 2 can optionally be configured such that the sensor includes at least one imaging element configured to produce an image of the sample based on the received reflected light.

In Example 4, the scanning system of any one or any combination of Examples 1-3 can optionally be configured such that the illuminator is configured to produce an illuminating beam including a calibration pattern.

In Example 5, the scanning system of any one or any combination of Examples 1-4 can optionally be configured such that the illuminating beam and the reflected light are angularly separated between ten degrees and fifteen degrees, inclusive.

In Example 6, the scanning system of any one or any combination of Examples 1-5 can optionally be configured such that an angular separation between the illuminating beam and the reflected light is fixed during operation.

In Example 7, the scanning system of any one or any combination of Examples 1-6 can optionally be configured such the illuminating beam and the reflected light are both in fixed orientations during operation.

In Example 8, the scanning system of any one or any combination of Examples 1-7 can optionally be configured such that the illuminator is configured to produce an illuminating beam including a wavelength spectrum having a full-width-at-half-maximum (FWHM) less than 70 nm.

In Example 9, the scanning system of any one or any combination of Examples 1-7 can optionally be configured such that the illuminator is configured to produce an illuminating beam including a wavelength spectrum having a full-width-at-half-maximum (FWHM) less than 40 nm.

In Example 10, the scanning system of any one or any combination of Examples 1-9 can optionally be configured such that the illuminator is configured to produce an illuminating beam including a wavelength spectrum having a peak wavelength between 513 nm and 523 nm, inclusive.

In Example 11, the scanning system of any one or any combination of Examples 1-9 can optionally be configured such that the illuminator is configured to produce an illuminating beam including a wavelength spectrum having a peak wavelength between 500 nm and 570 nm, inclusive.

In Example 12, the scanning system of any one or any combination of Examples 1-11 can optionally be configured such that the illuminator is configured to produce an illuminating beam including a wavelength spectrum that is monomodal.

In Example 13, the scanning system of any one or any combination of Examples 1-9 can optionally be configured such that the illuminator is configured to produce an illuminating beam including an emission range defined by wavelength values at 10%-of-maximum, the emission range having a short wavelength edge between 470 nm and 480 nm, inclusive, and a long wavelength edge between 565 nm and 575 nm, inclusive.

In Example 14, the scanning system of any one or any combination of Examples 1-13 can optionally be configured such that the illuminator includes a plurality of light sources configured to produce the illuminating beam; each light source, of the plurality of light sources, has a respective emission range defined by wavelength values at 10%-of-maximum; and the emission ranges of the plurality of light sources all overlap with one another.

In Example 15, the scanning system of any one or any combination of Examples 1-13 can optionally be configured such that the illuminator includes a plurality of light sources configured to produce the illuminating beam; and the wavelength spectrum of the illuminating beam is a resultant wavelength spectrum from a combination of the plurality of light sources.

In Example 16, the scanning system of any one or any combination of Examples 1-13 can optionally be configured such that the illuminator includes a plurality of light sources configured to produce the illuminating beam; and at least two light sources, from the plurality of light sources, are spatially separated from each other.

In Example 17, the scanning system of any one or any combination of Examples 1-13 can optionally be configured such that the illuminator includes at least one light emitting diode configured to produce the illuminating beam.

In Example 18, the scanning system of any one or any combination of Examples 1-17 can optionally further comprise a controller configured to provide an electrical signal to the fixation unit to move the fixation unit, provide an electrical signal to the illuminator, and receive an electrical signal from the sensor corresponding to an image of the sample.

In Example 19, the scanning system of Example 18 can optionally be configured such that the controller is configured to alternately adjust a position of the fixation unit and receive an image of the sample at the adjusted position.

In Example 20 the scanning system of Example 19 can optionally be configured such that the controller is configured to produce a three-dimensional geometry representing the sample, the three-dimensional geometry being produced using triangulation with one or more received images of the sample.

In Example 21, a method for producing a three-dimensional representation of a sample comprises producing an illuminating beam having a calibration pattern using a plurality of light emitting diodes, including producing an illuminating beam comprising a wavelength spectrum having a full-width-at-half-maximum (FWHM) less than 40 nm, a peak wavelength between 513 nm and 523 nm, and an emission range defined by wavelength values at 10%-of-maximum, the emission range having a short wavelength edge between 470 nm and 480 nm and a long wavelength edge between 565 nm and 575 nm; illuminating the sample with the illuminating beam; reflecting the illuminating beam off the sample to produce reflected light; collecting the reflected light at an angular separation between ten degrees and fifteen degrees, with respect to a propagation direction of the illuminating beam; and using the reflected light to form an image of the sample.

In Example 22, the method of Example 21 can optionally further comprise alternately repositioning the sample at a plurality of orientations and recording images of the sample at one or more of the plurality of orientations.

In Example 23, the system or method of any one or any combination of Examples 1-22 can optionally be configured such that all elements, operations, or other options recited are available to use or select from.

These and other examples and features of the present scanning system and method will be set forth, in part, in the following Detailed Description. This Overview is intended to provide non-limiting examples of the present subject matter. It is not intended to provide an exclusive or exhaustive explanation of the invention. The Detailed Description below is included to provide further information about the present scanning system and method.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
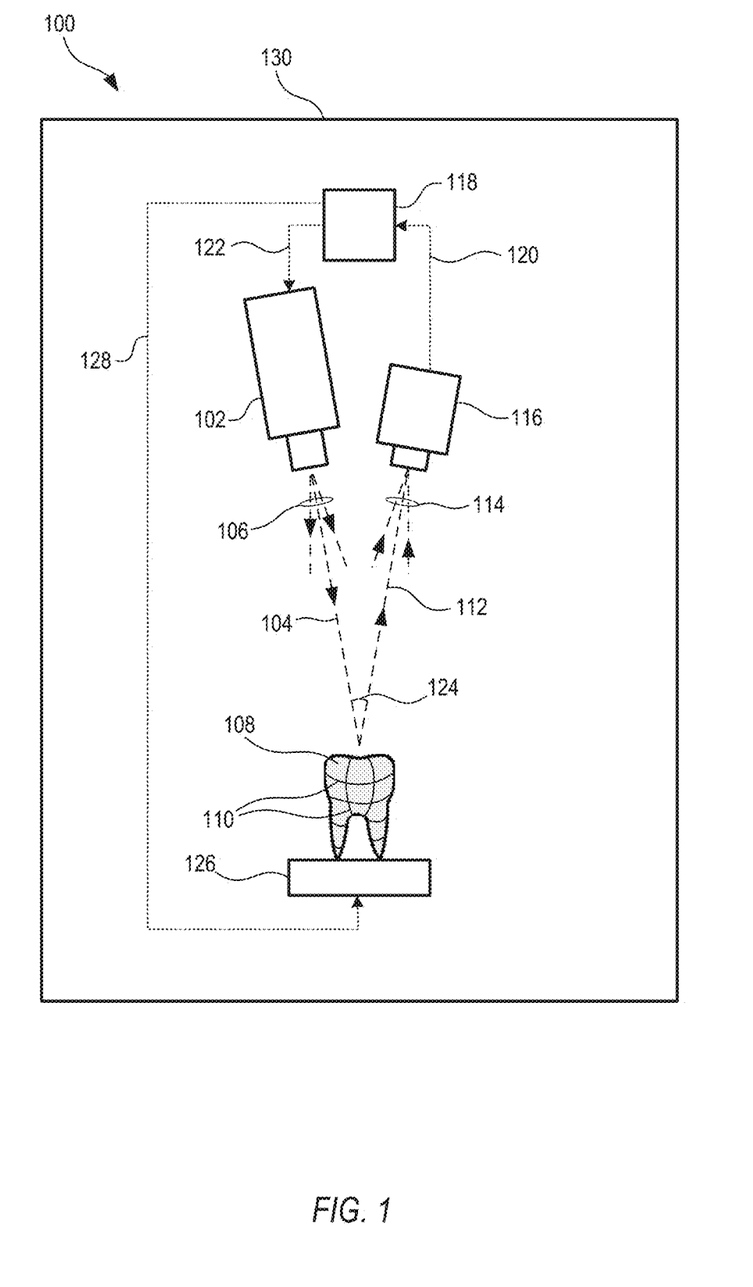
FIG. 1 is a schematic drawing of an example scanning system.

FIG. 1 is a schematic drawing of an example scanning system 100. Such a scanning system 100 is well-suited for use as a dental scanner, such as in a dental laboratory. In some applications, the system 100 may scan prosthetic dental objects that have not yet been implanted within the mouth of a patient. The system 100 may perform one or more scans of an object, the scans being taken from different angles and/or orientations, and may use the scans to produce a three-dimensional representation of the scanned object. The three-dimensional representation may be a data set. The data set may be used to perform visualizations of the scanned object, may be used for designing one or more additional elements to couple with the scanned object, and/or may be delivered to external devices that may fabricate a replica of the object. Other uses for the scanning system are contemplated as well.

In the example illustrated, the scanning system includes a housing 130. The housing 130 includes a fixation unit 126, which can receive a sample 108 to be measured. Suitable samples 108 can include, but are not limited to, a dental object, such as a model of a patient's jaw, a model of one or more parts of a patient's jaw, and a dental prosthesis. The fixation unit 126 mechanically supports the sample 108. The sample 108 may be removably attached to the fixation unit 126, such as by one or more mechanical clamps, one or more vacuum clamps, one or more magnetic clamps, and/or one or more straps. Alternatively, the sample 108 may rest upon the fixation unit 126, without an additional attachment mechanism. The fixation unit 126 may be stationary within the housing 130, or may be positionable in response to an electrical signal 128 from a controller 118. Positioning of the fixation unit 126 may include translating the fixation unit 126 in one, two, or three dimensions, rotating the fixation unit 126 about one, two, or three orthogonal axes, or any combination of the translations and rotations. In general, it is desirable that positioning of the fixation unit includes exposing a desired area on the sample 108 to an illuminating beam 104, and ensuring that the desired area is imaged by a sensor 116, for at least one of the fixation unit positions.

The housing 130 further includes an illuminator 102, which produces an illuminating beam 104 in response to a controlling electrical signal 122 from the controller 118. The illuminator 102 may be stationary, or may be positionable in response to the electrical signal 122 from the controller 118. The illuminating beam 104 is directed onto the sample 108 on the fixation unit 126. The illuminating beam 104 may be collimated, or may be diverging.

The illuminator 102 includes one or more light sources. Suitable light sources can include, but are not limited to, one or more light emitting diodes (LEDs), one or more laser diodes, one or more gas lasers, one or more fluorescent lamps, one or more incandescent sources, one or more broadband sources, or any combination of the above. A light source having multiple elements may have those elements grouped in close proximity, may have one or more of the elements spatially separated from the others, or may have all of the elements spatially separated from one another. For light source having a relatively broad wavelength spectrum, such as an incandescent source, the illuminator 102 may include an optional spectral filter, which transmits wavelengths inside a characteristic pass band and blocks wavelengths outside the pass band.

The illuminating beam 104 may optionally include a calibration pattern 106, such as a series of dark stripes, or a dark grid pattern, or a series of dark dots or fiducial marks. The illuminating beam 104 illuminates the sample 108, so that the calibration pattern 106 is superimposed on the sample 108. The calibration pattern 106 is deformed by the geometry of the sample 108, so that features, such as stripes, in the calibration pattern 106 appear bent along the shape of the sample 108 when viewed at non-normal incidence. In the example of FIG. 1, the calibration pattern 106 is a rectangular grid, which is drawn on the sample 108 as a series of curves 110 that appear to wrap around the geometry of the sample 108.

The housing 130 further includes a sensor 116, which receives the reflected light 112 that is reflected from the sample 108. The sensor 116 may be stationary within the housing 130, or may be positionable in response to an electrical signal 120 from the controller 118. For illustrated FIG. 1, it is assumed that the sensor 116 is stationary, so that the electrical signal 120 flows from the sensor to the controller 118.

The sensor 116 may include one or more imaging elements, such as a lens or a mirror, which forms an image of the sample 108 on a sensor element, such as a multi-pixel array detector. The sensor 116 may collect light entering the sensor 116 within a particular cone angle 114, where the cone angle is large enough to include the sample 108 on the fixation unit 126.

The reflected light 112 may include the calibration pattern 106 superimposed on the sample 108. The calibration pattern 106 may be distorted by the geometry of the sample 108, with a level of distortion determined by an angle 124 between the illuminating beam 104 and the reflected light 112. For an angle 124 of zero degrees, where the sensor 116 would view the sample 108 at normal incidence with respect to the illuminating beam 104, there would a relatively large amount of light arriving at the sensor, which is desirable, but little or no distortion of the calibration pattern 106, which is undesirable. For increasing angles 124, the amount of light arriving at the sensor 116 decreases, but the calibration pattern 106 distortion increases. In practice, it is desirable to strike a balance between light level and distortion level. Preferred angles 124 may be in the range of ten to fifteen degrees, although suitable angles may be as small as five degrees and as large as twenty degrees, twenty-five degrees, or thirty degrees.

The sensor 116 captures an image of the sample 108, converts it to an electrical signal 120, and directs the electrical signal 120 to the controller 118. The controller 118 may receive the electrical signal 120, convert the electrical signal 120 to intensity data as a function of location in an image, and may use the relative positions and orientations of the illuminator 102, the fixation unit 126 and the sensor 116 to determine a three-dimensional geometry of the sample 108. Such a determination generally uses multiple images of the sample 108, obtained from a variety of orientations with respect to the illuminator 102 and sensor 116. In various examples, the illuminator 102 and the sensor 116 remain fixed, the fixation unit 126 translates and/or rotates through a range of positions and/or angles in two dimensions, and the sensor 116 acquires images between movements of the fixation unit 126. Once the images are acquired, the controller 118 uses the technique of triangulation to determine the three-dimensional geometry of the sample 108. Once a three-dimensional geometry has been determined, the three-dimensional geometry may be saved as a data set, may be displayed to a user from one or more points of view, may be used to plan the shape of one or more prosthetic dental parts, may be used to plan implantation strategies for the one or more prosthetic dental parts, or may be used for other suitable purposes.

In some examples, the controller 118 includes a computer than can perform the calculations to extract the three-dimensional geometry from the series of images. In other examples, the controller 118 may include an interface to an external computer or network, so that the calculations may be performed external to the system 100.

Figure 2:
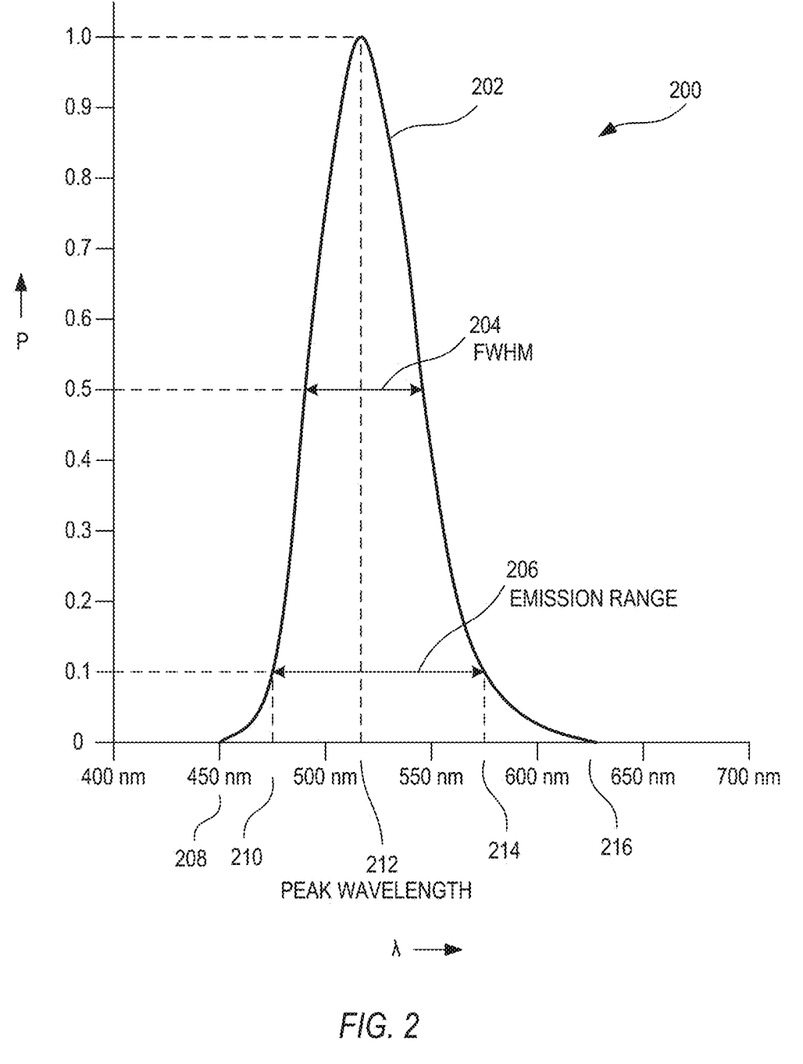
FIG. 2 is a plot of an example wavelength spectrum of illuminating light used in the scanning system of FIG. 1.

It is found that the wavelength spectrum of the light source(s) in the illuminator 102 affects the quality of the images received at the sensor 116, and therefore affects the quality of the three-dimensional geometry determined by the system 100. FIG. 2 is an example plot 200 of the wavelength spectrum of illuminating light used in the scanning system 100 of FIG. 1. The plot 200 of FIG. 2 is helpful in providing graphical representations of several of the defined quantities discussed below.

The plot 200 shows the spectrum, plotted as a normalized power (P) as a function of wavelength ($\lambda$). The spectrum has a peak power, with a value P of 1.0, at a peak wavelength shown as element 212. The spectrum has a width, defined as a full-width-at-half-maximum (FWHM), shown as element 204. The spectrum has an emission range, having low and high wavelength edges defined by the wavelength values at 10%-of-maximum, bounded by elements 210 and 214, with an emission range width shown as element 206. The spectrum falls to zero at elements 208 and 216.

Regarding the width of the spectrum 202, it is found that a relatively narrow wavelength spectrum produces better results than a relatively broad wavelength spectrum. Such a relatively narrow wavelength spectrum can reduce the effects of chromatic aberration in the imaging lens or lenses in the sensor 116. Light having a single peak wavelength 212 may be referred to as being monomodal. Such monomodal light may have a relatively narrow wavelength spectrum. In some examples, such monomodal light may have relative power contributions (P) that decrease monotonically on either side of the peak wavelength 212. Monomodal light has a spectral width that may be defined by a FWHM 204 in power (P). Suitable spectral widths 204 include, but are not limited to, less than 30 nm, less than 40 nm, less than 70 nm, and less than 100 nm, although other suitable spectral widths 204 may also be used. In contrast, a broad wavelength spectrum can include multiple discrete wavelength peaks, and/or a single wavelength distribution that has a FWHM 204 greater than 100 nm.

In some examples, where the illuminator 102 includes multiple light sources, such as multiple LEDs, it is desirable to make the wavelength spectra of the light sources as close to one another as is practical. In practice, there might be slight variation from source-to-source. In some examples, the resultant wavelength spectrum from the combined sources has a FWHM 204 of less than 100 nm. In some examples, the resultant wavelength spectrum from the combined sources is monomodal. In some examples, each source has an emission range 206 having short 210 and long 214 wavelength edges defined by the wavelength values at 10%-of-maximum, and the emission ranges 206 of the sources all overlap with one another. For each of the above examples, the light from the combined sources is monomodal.

Regarding the peak wavelength 212 of the spectrum 202, it is found, unexpectedly, that light in the green portion of the spectrum produces better results than in other portions of the spectrum. For instance, because diffraction theory predicts that the smallest resolvable feature in an image is proportional to the wavelength of the illuminating light, one of ordinary skill in the art would be taught to use illuminating light having a relatively short wavelength, such as in the ultraviolet or violet portion of the spectrum. However, it is found that the optical properties of typical objects that may be scanned in dental laboratories may produce unsatisfactory results when the objects are illuminated with ultraviolet or violet light. For example, when such a typical object is illuminated with ultraviolet or violet light, the resulting image may have an unacceptably low contrast. It is found that the contrast may be improved when the illuminating light is in the green portion of the spectrum. In addition, it is found that ultraviolet or violet light can damage some of the materials used for prosthetic dental objects and other typical objects that may be scanned in dental laboratories. Furthermore, the optical elements in the sensor may not function efficiently or may not function at all for ultraviolet light.

Values of peak wavelength 212 that are suitable for use in the example scanning system 100 include 518 nm, and include ranges of 513 nm to 523 nm, 500 nm to 570 nm, 470 nm to 580 nm, and 450 nm to 600 nm. Values of the short wavelength edge 210, defined by a wavelength value at 10%-of-maximum as in FIG. 2, that are suitable for use in the example scanning system 100 include a range of 470 nm to 480 nm. Values of the long wavelength edge 214, defined by a wavelength value at 10%-of-maximum as in FIG. 2, that are suitable for use in the example scanning system 100 include a range of 565 nm to 575 nm. These numerical values and ranges are applicable to systems using either a single light source, or using multiple light sources. For the use of multiple light sources, the spectrum shown by example in FIG. 2 is a resultant wavelength spectrum from the combined sources.

Figure 3:
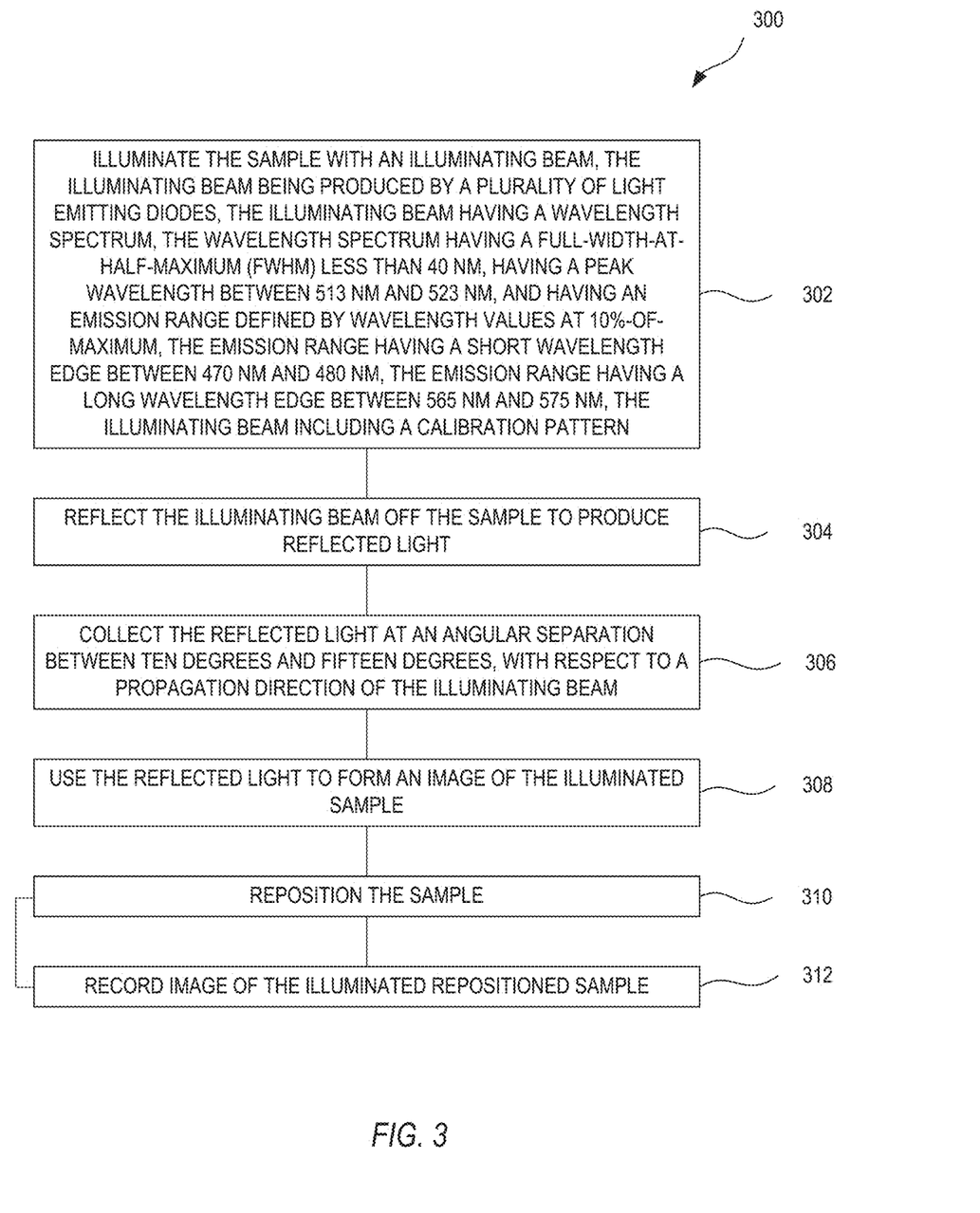
FIG. 3 is a flow chart of an example method of operation of the scanning system of FIG. 1.

FIG. 3 is a flow chart of an example method of operation 300 of the scanning system 100. Step 302 illuminates the sample with an illuminating beam, the illuminating beam being produced by a plurality of light emitting diodes, the illuminating beam having a wavelength spectrum, the wavelength spectrum having a full-width-at-half-maximum (FWHM) less than 40 nm, having a peak wavelength between 513 nm and 523 nm, and having an emission range defined by wavelength values at 10%-of-maximum, the emission range having a short wavelength edge between 470 nm and 480 nm, the emission range having a long wavelength edge between 565 nm and 575 nm, the illuminating beam including a calibration pattern. Step 304 reflects the illuminating beam off the sample to produce reflected light. Step 306 collects the reflected light at an angular separation between ten degrees and fifteen degrees, with respect to a propagation direction of the illuminating beam. Step 308 uses the reflected light to form an image of the illuminated sample. Step 310 repositions the sample. Step 312 records an image of the illuminated repositioned sample. Steps 310 and 312 are alternately repeated as needed.

The above Detailed Description includes references to the accompanying drawings, which form a part of the Detailed Description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above Detailed Description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for producing a three-dimensional representation of a sample, comprising:

removably mechanically supporting the sample;

producing an illuminating beam using an illuminator comprising a plurality of light emitting diodes, the illuminating beam comprising green light selected to enhance a contrast in reflection of the illuminating beam from a surface of the sample;

directing the green illuminating beam towards the sample so that the illuminating beam is reflected off the surface of the sample to produce reflected light, wherein the illuminating beam comprises a calibration pattern;

superimposing the calibration pattern on the sample;

by way of a sensor, collecting the reflected light at an angular separation with respect to a propagation direction of the illuminating beam;

using the reflected light to form a first image of the sample;

repositioning the sample to a different orientation and recording a second image of the sample at the different orientation;

producing a three-dimensional geometry representing the sample, the three-dimensional geometry being produced using triangulation with the first and second images of the sample.

2. The method of claim 1, further comprising producing the first and second images of the sample using an imaging element.

3. The method of claim 1, further comprising, by way of the sensor, collecting the reflected light at an angular separation of between about 5° and 30°.

4. The method of claim 1, further comprising repositioning the sample to a plurality of different orientations in multiple dimensions, and recording images of the sample after repositioning to produce the three-dimensional geometry representing the sample using triangulation.

5. The method of claim 1, wherein the illuminating beam has a wavelength spectrum with a full-width-at-half-maximum (FWHM) less than 40 nm, a peak wavelength between 500 nm and 570 nm, inclusive, and an emission range defined by wavelength values at 10%-of-maximum, the emission range having a short wavelength edge between 470 nm and 480 nm, inclusive, and a long wavelength edge between 565 nm and 575 nm, inclusive.

6. The method of claim 1, further comprising rotating and translating the sample through a range of positions and angles in multiple dimensions during the imaging process.

7. The method of claim 1, wherein the illuminating beam has a wavelength spectrum having a full-width-at-half-maximum (FWHM) less than 100 nm.

8. The method of claim 1, further comprising moving a position of the illuminator.

9. A method for producing a three-dimensional representation of a dental prosthesis, comprising:

removably mechanically supporting the dental prosthesis;

producing an illuminating beam using an illuminator comprising a plurality of light sources, the illuminating beam comprising green light selected to enhance a contrast in reflection of the illuminating beam from a surface of the dental prosthesis;

directing the green illuminating beam towards the dental prosthesis so that the illuminating beam is reflected off the surface of the dental prosthesis to produce reflected light;

by way of a single sensor, collecting the reflected light at an angular separation with respect to a propagation direction of the illuminating beam;

using the reflected light captured by the single sensor to form a first image of the dental prosthesis;

repositioning the dental prosthesis in multiple dimensions to a plurality of different orientations, relative to the illuminator and the single sensor and recording a plurality of images of the dental prosthesis at the different orientations; and producing a three-dimensional geometry representing the dental prosthesis, the three-dimensional geometry being produced using triangulation with the first image and the plurality of images of the dental prosthesis.

10. The method of claim 9, wherein the plurality of light sources comprises a plurality of light emitting diodes.

11. The method of claim 9, wherein the illuminating beam comprises a calibration pattern.

12. The method of claim 11, wherein the calibration pattern comprises a series of dark stripes, a dark grid pattern, or a series of dark dots or fiducial marks.

13. The method of claim 11, further comprising superimposing the calibration pattern on the dental prosthesis.

14. The method of claim 9, wherein the sensor comprises an imaging element, and the method further comprises producing the first image of the dental prosthesis using the imaging element.

15. The method of claim 9, wherein the illuminating beam has a wavelength spectrum with a full-width-at-half-maximum (FWHM) less than 40 nm, a peak wavelength between 500 nm and 570 nm, inclusive, and an emission range defined by wavelength values at 10%-of-maximum, the emission range having a short wavelength edge between 470 nm and 480 nm, inclusive, and a long wavelength edge between 565 nm and 575 nm, inclusive.

16. A method for producing a three-dimensional representation of a dental prosthesis, comprising:

i. removably mechanically supporting the dental prosthesis;

ii. generating an illumining beam using an illuminator having a plurality of light sources, the illuminating beam comprising green light;

iii. causing the green illuminating beam to reflect light off of the dental prosthesis toward a single sensor comprising single imaging element;

iv. by way of the single sensor, collecting the reflected light at an angular separation with respect to a propagation direction of the illuminating beam;

v. using the reflected light captured by the single sensor to form an image of the dental prosthesis, the image having an improved contrast as compared to if steps (ii)-(iv) were performed using light from a non-green portion of the light spectrum;

vi. repositioning the dental prosthesis in multiple dimensions to a plurality of different orientations relative to the illuminator and the single sensor;

vii. repeating steps (ii)-(v) at each orientation to produce a plurality of images of the dental prosthesis at each different orientation; and viii. producing a three-dimensional geometry representing the dental prosthesis, the three-dimensional geometry being produced using triangulation with the images produced of the dental prosthesis.

17. The method of claim 16, wherein the illuminating beam has a wavelength spectrum with a full-width-at-half-maximum (FWHM) less than 40 nm, a peak wavelength between 500 nm and 570 nm, inclusive, and an emission range defined by wavelength values at 10%-of-maximum, the emission range having a short wavelength edge between 470 nm and 480 nm, inclusive, and a long wavelength edge between 565 nm and 575 nm, inclusive.

18. The method of claim 16, wherein the plurality of light sources comprises a plurality of light emitting diodes.

19. The method of claim 16, further comprising rotating and translating the dental prosthesis through a range of positions and angles in multiple dimensions during the imaging process.

20. The method of claim 19, further comprising moving a position of the illuminator.

* * * * *